United States Patent [19]

Matsushita

[11] Patent Number: 4,881,112
[45] Date of Patent: Nov. 14, 1989

[54] IC WITH RECOMBINATION LAYER AND GUARD RING SEPARATING VDMOS AND CMOS OR THE LIKE

[75] Inventor: Tsutomu Matsushita, Yokohama, Japan

[73] Assignee: Nissan Motor Company, Limited, Yokohama, Japan

[21] Appl. No.: 196,714

[22] Filed: May 20, 1988

[30] Foreign Application Priority Data

May 29, 1987 [JP] Japan ............... 62-133962

[51] Int. Cl.$^4$ ............... H01L 29/74
[52] U.S. Cl. ............... 357/47; 357/12; 357/52; 357/48; 357/23.4; 357/43
[58] Field of Search ............... 357/52, 47, 48, 23.4, 357/43; 437/12

[56] References Cited

U.S. PATENT DOCUMENTS

| | | | |
|---|---|---|---|
| 3,894,893 | 7/1975 | Kabaya | 437/12 |
| 3,988,762 | 10/1976 | Cline | 357/64 |
| 4,053,925 | 10/1977 | Burr et al. | 357/64 |
| 4,559,086 | 12/1985 | Hawkins | 437/12 |
| 4,593,458 | 6/1986 | Adler | 357/52 |
| 4,620,211 | 10/1986 | Baliga et al. | 357/38 |
| 4,656,497 | 4/1987 | Rogers | 357/50 |

FOREIGN PATENT DOCUMENTS 60-51700  3/1985  Japan .

OTHER PUBLICATIONS

S. M. Sze, "Physics of Semiconductor Devices", John Wiley and Sons, New York, 1981, pp. 37-38.
Wrathall, "The Design of a High Power Solid State Automotive Switch in CMOS-VDMOS Technology," IEEE, Power Electronics Specialists Conference Record, 1985, pp. 229-233.
Einzinger et al., "Monolithic IC Power Switch for Automotive Applications," ISSCC 86/Wednesday, Feb. 19, 1986, California Pavilion Session I: Analog Techniques; 1986 IEEE International Solid-State Circuits Conference; pp. 22-23, 289.

Primary Examiner—Andrew J. James
Assistant Examiner—David Soltz
Attorney, Agent, or Firm—Foley & Lardner, Schwartz, Jeffery, Schwaab, Mack, Blumenthal & Evans

[57] ABSTRACT

In an integrated circuit device having a highly doped bottom substrate layer of a first conductivity type, a lightly doped top layer of the first conductivity type formed on the substrate layer, a vertical MOSFET formed in the lightly doped top layer and a second circuit component, such as a CMOS, formed in the lightly doped top layer, there are further provided a guard ring and a recombination layer for preventing latchup of the second component by preventing minority carriers from moving from the vertical MOSFET to the second component. The guard ring is formed in the lightly doped top layer between the vertical MOSFET and the second component, and made of a second conductivity type single crystal semiconductor, or a first conductivity type polycrystalline silicon or an insulating material such as $SiO_2$. The recombination layer is formed between the bottom substrate layer and the lightly doped top layer so as to separate at least the second component from the bottom substrate layer, and made of the first conductivity type polycrystalline silicon.

18 Claims, 6 Drawing Sheets

IC WITH RECOMBINATION LAYER AND GUARD RING SEPARATING VDMOS AND CMOS OR THE LIKE

REFERENCES TO THE RELATED APPLICATIONS

A U.S. patent application No. 063,116 (filed on Jun. 17, 1987) relates to an IC device similar to that of the present invention. A U.S. applications No. 119,453 (filed on Nov. 10, 1987) discloses a carrier recombination layer similar to that of the present invention. A similar recombination layer is disclosed also in a U.S. application No. 179,315, filed on Apr. 8, 1988.

BACKGROUND OF THE INVENTION

The present invention relates to a semiconductor device in which a power vertical MOSFET (referred to hereinafter as VDMOS), and another circuit component such as CMOS are formed in a single semiconductor chip.

Recently, there is proposed an integrated circuit device (so-called power IC) in which a power VDMOS used as a switching element for various loads mounted on a vehicle, and other components, such as CMOS, forming a peripheral circuit of the VDMOS are monolithically formed in a single chip.

To facilitate understanding of the present invention, reference is first made to a conventional example shown in FIG. 6. A power IC device of FIG. 6 includes at least one VDMOS 10, and at least one CMOS consisting of a p channel MOSFET (pMOS) 20 and an n channel MOSFET (nMOS) 30. These circuit components are formed on and within a single semiconductor substrate, which consists of a highly doped n+ bottom layer 1 including a bottom surface of the substrate, and a lightly doped n− top layer 2 formed on the bottom layer 1 by epitaxial growth or other techniques. The top layer 2 extends from the bottom layer 1 to a top surface of the substrate.

The VDMOS 10 has a p channel region 3 extending into the n− top layer 2 from the top surface, and an n+ source region 4 extending into the p channel region 3 from the top surface. In this VDMOS 10, the n− top layer 2 serves substantially as a drain region. A gate electrode 6 insulated by a gate oxide film 5 is formed above the p channel region 3 so that a channel 3a can be induced in the p channel region 3 between the n+ source region 4 and the n− top layer 2 functioning as a drain. There are further provided a PSG insulating layer 7, a topside source electrode 8 and a bottom drain electrode 9.

The pMOS 20 has a p+ pair of source and drain regions 11 and 12 both formed in the n− top layer 2, a gate electrode 14 insulated by a gate oxide film 13, a source electrode 15 and a drain electrode 16. The source electrode 15 is connected to the n− top layer 2 through an n+ substrate contact region 17.

The nMOS 30 is formed in a p well 18 which is formed in the n− top layer 2. The nMOS 30 has an n+ pair of source and drain regions 21 and 22 both formed in the p well 18, a gate electrode 24 insulated by a gate oxide film 23, a source electrode 25 and a drain electrode 26. The source electrode 25 is connected to the p well 18 through a p+ well contact region 27.

In this power IC, the potential of the n− top layer 2 is fixed at a supply voltage Vdd applied from the drain electrode 9, so that the VDMOS 10 and the CMOS are electrically separated, and able to act independently from each other. For this reason, the VDMOS 10 is used in a source follower configuration in which a load is connected between a source electrode 8 of the VDMOS 10 and the ground.

The VDMOS is superior as an output device of the power IC because it is driven by voltage, and it is easy to make the withstand voltage high and the on resistance low. On the other hand, the CMOS is well qualified as a logic device of the power IC because the power consumption is low and the noise margin is high. Therefore, the power IC in which the VDMOS and CMOS are integrated with a relatively simple structure, is advantageous in spite of slight restriction due to the necessity of the source follower configuration.

However, such a simple structure of the above mentioned device cannot reliably prevent interference between the VDMOS and CMOS in a dynamic and transient state, so that this conventional device is liable to cause malfunction as illustrated in 7 and 8.

In an example shown in FIG. 8, power ICs are used in drive circuits of a H bridge type for driving an inductive load 28 such as a DC motor. The circuit of FIG. 8 includes power ICs 40a and 40b and MOSFETs 29 and 31.

When, in the drive circuit of FIG. 8, a VDMOS of the power IC 40a and MOSFET 31 are on, a VDMOS of the power IC 40b and MOSFET 29 are off, the load 28 is driven by a current flowing in directions $I_1$ and $I_2$. If the MOSFET 31 is then turned off at some instant, a so-called flywheel current continues flowing in a direction $I_3$ for a while after that instant. This flywheel current $I_3$ flows into the source electrode of the VDMOS of the power IC 40b, which is shown in FIG. 7. Because of the flywheel current $I_3$ flowing into the source electrode 8 of the VDMOS 10 shown in FIG. 7, holes (minority carriers) 32 are injected from the p-type channel region 3 of the VDMOS 10 into the n− layer 2, and these holes 32 reach the p well 18 of the CMOS.

The flywheel current $I_3$ has a magnitude approximate to the steady state current of the load 28, and the current density reaches a much higher value as compared with external noise applied to a conventional CMOS IC. Therefore, the CMOS in the power IC is brought into latchup by the holes 32 reaching the p well 18 much more easily than a conventional CMOS IC. For this reason, the conventional power IC shown in FIG. 6 is practically unusable without some means for preventing latchup.

FIG. 9 shows another conventional example. The device of FIG. 9 is provided with a p-type guard ring 33 which is formed in the n− layer between the VDMOS 10 and the CMOS constituted by the pMOS 20 and the nMOS 30. The guard ring 33 reaches the n+ bottom layer 1, and surrounds the VDMOS 10. The p guard ring 33 is grounded through a guard ring electrode 34.

The guard ring 33 absorbs the holes 32 which are injected from the p channel region 3 and diffuse toward the CMOS in the n− layer 2, so that these holes flow out to the ground without reaching the CMOS. The n+ bottom layer 1 below the guard ring 33 has a high impurity concentration and a hole diffusion length shorter than that of the n− layer 2. Therefore, the number of the holes diffusing through n+ bottom layer 1 to the CMOS is relatively small. However, especially, in a power IC having VDMOS and CMOS of large current capacities, the number of the holes flowing to the CMOS through the n+ bottom layer 1 amounts to such a considerable level as to trigger latchup. It is not possible to reduce the possibility of latchup sufficiently by the guard ring alone.

SUMMARY OF THE INVENTION

Therefore, it is an object of the present invention to provide a semiconductor device capable of preventing undesired interference between a vertical MOSFET and another integrated circuit component such as CMOS, in a reliable manner.

According to the present invention, a semiconductor device comprises (i) a highly doped lower layer of a first conductivity type, formed in a substrate body, (ii) a lightly doped upper layer of the first conductivity type, formed above the highly doped lower layer within the substrate body, (iii) a vertical MOSFET formed in a first portion of the lightly doped upper layer so that the first portion of the lightly doped upper layer is used substantially as a drain region of the vertical MOSFET, (iv) a second circuit component, such as CMOS, formed in a second portion of the lightly doped upper layer, (v) a guard ring formed in the lightly doped upper layer so as to separate the first and second portions, and (vi) a recombination layer for facilitating recombination of minority carriers. The recombination layer is formed between the highly doped lower layer and the lightly doped upper layer. The recombination layer is formed on the highly doped lower layer, and at least the second portion of the lightly doped upper layer is formed on the recombination layer. The guard ring is deep, and reaches the recombination layer.

The recombination layer is made of a material capable of promoting recombination of carriers. One preferable example is polycrystalline silicon, doped with impurities of the first conductivity type.

In one embodiment of the invention, all of the first and second portions of the lightly doped upper layer and the guard ring are formed on the recombination layer, and separated from the highly doped lower layer by the recombination layer. In another embodiment, the first portion of the lightly doped upper layer is formed directly on the highly doped lower layer and the recombination layer is formed under the second portion and the guard ring only. In still another embodiment, the guard ring is made of an insulating material such as $SiO_2$, or the polycrystalline silicon doped with impurities of the first conductivity type.

DETAILED DESCRIPTION OF THE INVENTION

Figure 1:
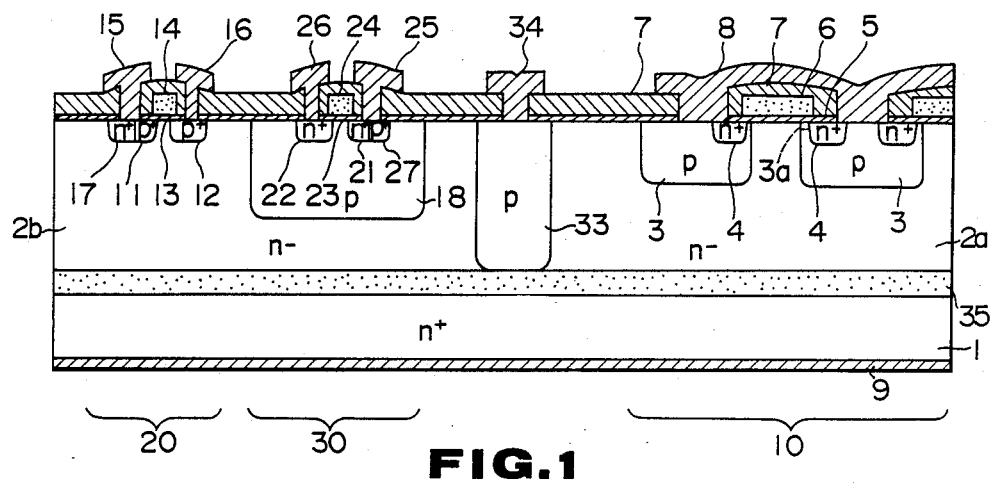
FIG. 1 is a vertical section of a semiconductor device according to a first embodiment of the present invention.
Figure 2:
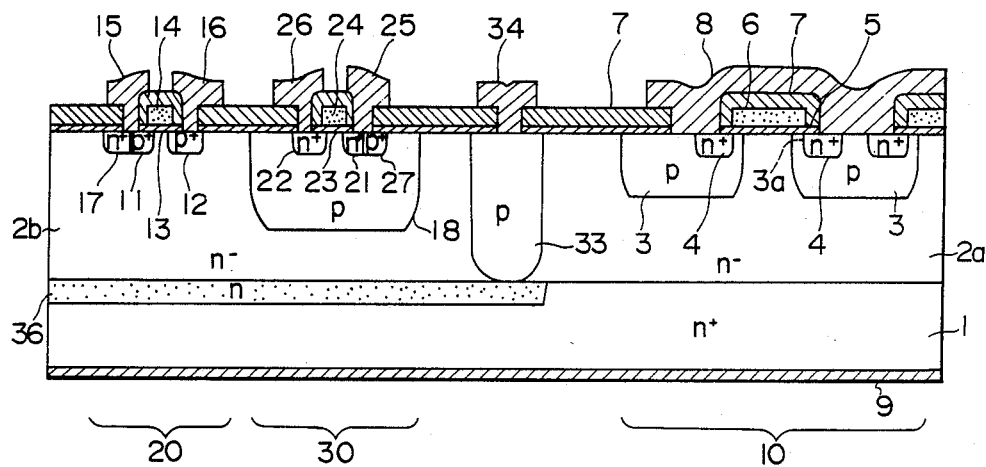
FIG. 2 is a vertical section of a semiconductor device according to a second embodiment of the present invention.

A first embodiment of the present invention is shown in FIG. 1.

An integrated circuit device of FIG. 1 is formed on and in a substrate, which includes a highly doped n+ bottom layer 1, and a lightly doped n− top layer 2 formed above the bottom layer 1.

At least one VDMOS 10 is formed in a first portion 2a of the n− top layer 2, which serves substantially as a drain region of the VDMOS 10. The VDMOS 10 includes a p-type channel region 3 formed in an uppermost part of the n− top layer 2, and an n+ source region 4 formed in the p channel region 3. A gate electrode 6 for inducing a channel 3a in a surface layer of the p channel region 3 is formed above the p channel region 3 between the n+ source region 4 and the n− region 2 acting as a drain. The gate electrode 6 is insulated from the semiconductor surface by a gate oxide layer 5. There are further provided an intermediate insulating layer 7 of PSG or the like, a source electrode 8, and a drain electrode 9 formed on the bottom of the n+ bottom layer 1. The source electrode 8 is connected with the n+ source region 4 and the p channel region 3.

At least one CMOS forming a peripheral circuit of the VDMOS 10 is formed in a second portion 2b of the n− top layer 2 near the VDMOS 10. The CMOS is a pair of a p channel MOSFET (pMOS) 20 and an n channel MOSFET (nMOS) 30.

The pMOS 20 includes a pair of p+ source region 11+ region 12 which are both formed in an uppermost part of the n− layer 2, a gate electrode 14 formed on a gate oxide insulating layer 13, a source electrode 15 and a drain electrode 16. The source electrode 15 is connected with the n− layer 2 through an n+ substrate contact region 17.

The nMOS 30 is formed in a p well 18 formed in an uppermost part of the n− layer 2. The nMOS 30 includes a pair of n+ source region 21 and n+ drain region 22 which are both formed in an uppermost part of the p well 18, a gate electrode 24 formed on a gate oxide insulating layer 23, a source electrode 25 and a drain electrode 26. The source electrode 25 is connected with the p well 18 through a p+ well contact region 27.

The semiconductor device of FIG. 1 further includes a recombination layer 35 for facilitating recombination of minority carriers. The recombination layer 35 is formed between the n− top layer 2 and the n+ bottom layer 1. The recombination layer 35 is made of a material having a good capability of promoting recombination of minority carriers, and a very high recombination velocity. The recombination layer 35 of this embodiment is an n-type polycrystalline Si layer. The recombination velocity in the n-type polycrystalline Si is higher than that in the single crystal Si substrate. Although it is affected by the impurity concentration and the fabrication method of the polycrystalline Si, the recombination velocity of the n-type polycrystalline Si in a typical case is 1000 times as high as that of the single crystal Si. The impurity concentration of the recombination layer 35 is substantially equal to or higher than that of the highly doped n+ bottom layer 1. The thickness of the recombination layer 35 is made equal to or greater than about 100 A (angstrom) in order to prevent tunneling of minority carriers. In this embodiment, the thickness of the recombination layer 35 is equal to or smaller than about 10 μm.

The semiconductor device of FIG. 1 further includes a p-type guard ring 33 formed in the n− top layer 2 between the VDMOS 10, and the CMOS consisting of the pMOS 20 and the nMOS 30. The guard ring 33 extends deeply from the top surface of the n− top layer 2, and reaches the recombination layer 35 formed on the bottom of the n− layer 2. The guard ring 33 is formed in the layer 2 so as to separate the first portion 2a of the layer 2 in which the VDMOS 10 is formed, and the second portion 2b in which the CMOS is formed. The guard ring 33 is grounded through a guard ring electrode 34.

Figure 8:
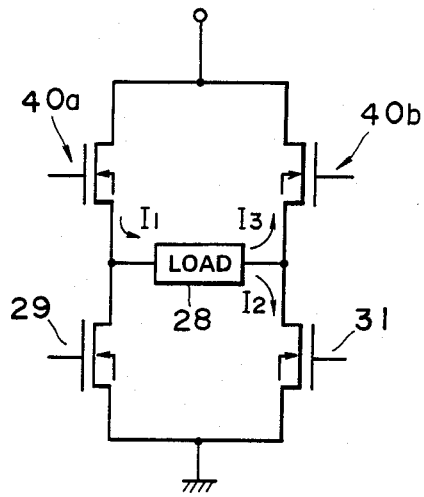
FIG. 8 is a diagram of a drive circuit using the device of FIG. 6.
Figure 9:
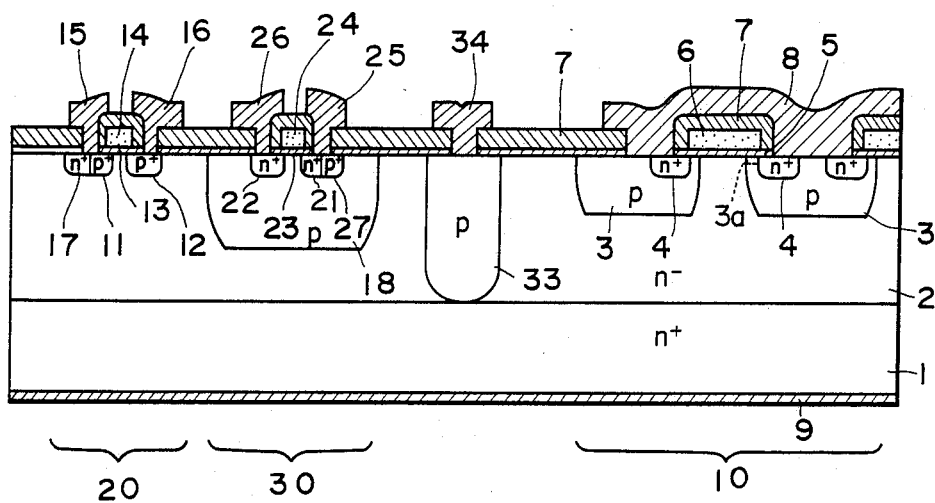
FIG. 9 is a vertical section of a second conventional semiconductor device.

The device of FIG. 1 is operated as follows:

When the device is used in the H bridge type drive circuit as shown in FIG. 8, the flywheel current flows into the source electrode 8 of the VDMOS 10, and holes are injected from the p channel region 3 into the first portion 2a of the n− layer 2 in the same manner as in the conventional device.

However, the guard ring 33 and the recombination layer 35 prevent, in cooperation, latchup of the CMOS from being triggered by the injected holes. The guard ring 33 absorbs the holes which diffuse in the first portion 2a of the n− layer 2 and reach the guard ring 33, and leads these holes to the ground. On the other hand, the recombination layer 35 intercepts the holes diffusing toward the n+ bottom layer 1, and causes these holes to recombine with electrons and to disappear quickly. In this way, the device of FIG. 1 can reliably prevent latchup of the CMOS by preventing the injected holes from flowing from the first portion 2a to the second portion 2b of the n− layer 2.

A second embodiment of the present invention is shown in FIGS. 2 and 3A-3H. In the second embodiment, a recombination layer 36 is formed only under the p guard ring 33 and the second portion 2b of the n− layer 2. There is formed no recombination layer between the n+ bottom layer 1 and the first portion 2a of the n− layer 2 in which the VDMOS 10 is formed. The first portion 2a is formed directly on the n+ bottom layer 1 while the recombination layer 36 is interposed between the second portion 2b and the bottom layer 1 and between the guard ring 33 and the bottom layer 1. The recombination layer 36 of the second embodiment is also an n-type polycrystalline Si layer whose impurity concentration is substantially equal to or higher than that of the n+ layer 1.

The recombination layer 36 catches holes diffusing from the first portion 2a of the n− layer 2 through the n+ bottom layer 1 toward the second portion 2b, and causes these holes to recombine and disappear. Therefore, the recombination layer 36 of the second embodiment can also prevent latchup of the CMOS sufficiently in cooperation with the guard ring 33 like the recombination layer 35 of the first embodiment.

In the second embodiment, there is no recombination layer between the first portion 2a of the VDMOS 10 and the bottom layer 1. Therefore, the on resistance of the VDMOS 10 is not increased, but held at a level of a discrete device.

FIGS. 3A-3H show one example of a process for fabricating the device of the second embodiment. At a step shown in FIG. 3A, a part of the top surface of the n+ substrate forming the bottom layer 1 is lowered by etching and a step is formed.

Figure 3A:
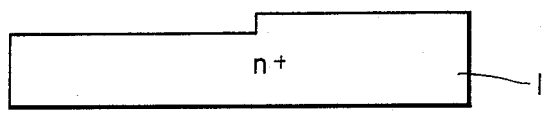
FIGS. 3A-3H are vertical sections for showing a process of fabricating the device of FIG. 2.
Figure 3B:
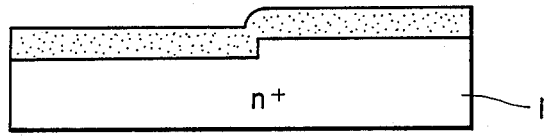

At a step of FIG. 3B, a polycrystalline silicon layer is deposited on the stepped surface of the n+ substrate 1 by CVD or other techniques.

Figure 3C:
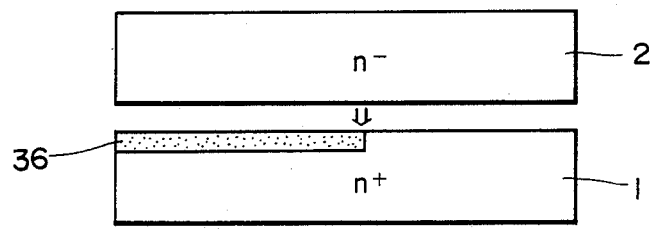

At a step of FIG. 3C, the surface of the polycrystalline silicon layer is ground, until the polycrystalline silicon layer is removed from the raised part of the top surface of the substrate 1, and left only on the lowered part of the substrate surface. In this way, the recombination layer 36 is formed on the lowered part of the substrate surface. Then, another silicon substrate forming the n− top layer 2 and the substrate 1 formed with the recombination layer 36 are tightly placed one upon the other after treatment of making the surfaces of the substrates hydrophilic.

Figure 3D:
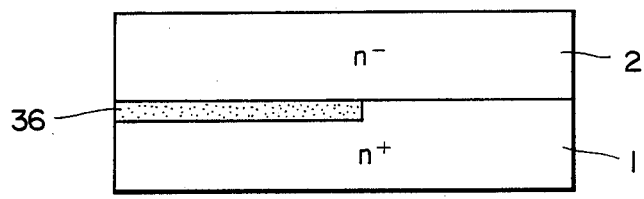

At a step of FIG. 3D, the substrate of the n− top layer 2 and the substrate of the n+ bottom layer 1 are bonded together by annealing at an appropriate temperature. This technique for bonding silicon wafers together is known (Japanese patent provisional publication No. 60-51700).

Figure 3E:
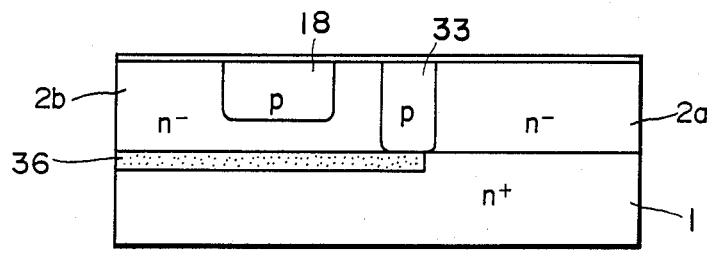

At a step of FIG. 3E, the p well 18 and the p guard ring 33 are formed by diffusion of a p-type impurity.

Figure 3F:
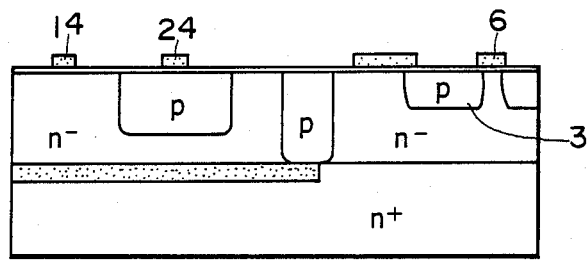

At a step of FIG. 3F, the gate electrodes 6, 14 and 24 of the VDMOS 10, pMOS 20 and nMOS 30 are formed by depositing a polycrystalline layer and patterning the deposited layer by photoetching. Then, the p channel region 3 of the VDMOS 10 is formed by p-type impurity diffusion using the gate electrode 6 as a mask.

Figure 3G:
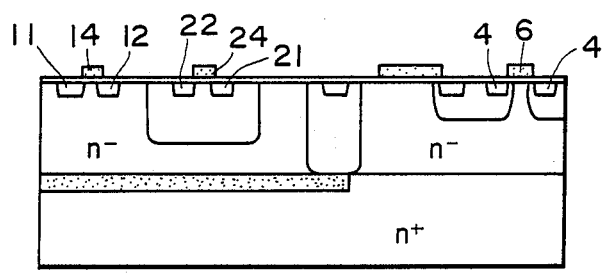

At a step of FIG. 3G, the n source region 4 of the VDMOS 10, and the n+ source and drain regions 21 and 22 of the nMOS 30 are formed by n-type impurity diffusion using the gate electrodes 6 and 24 as a mask. The p+ source and drain regions 11 and 12 of the pMOS 20 are formed by p-type impurity diffusion using the gate electrode 14 as a mask.

Figure 3H:
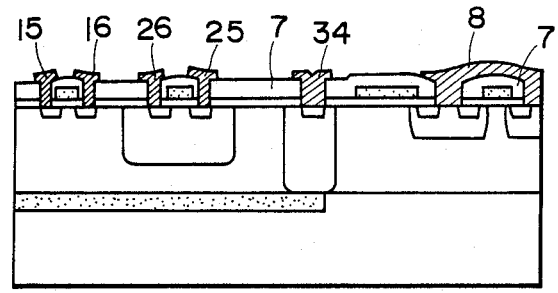

At a step of FIG. 3H, contact holes are formed by photoetching after formation of the intermediate insulating layer 7 of PSG. Then, the electrodes 8, 15, 16, 25, 26 and 34 are formed by vapor deposition of an Al film and photoetching.

The device of the first embodiment can be fabricated in the same manner. However, the fabrication process of the first embodiment is simplified because the recombination layer of the first embodiment can be formed more easily without need for the step of FIG. 3A.

Figure 4:
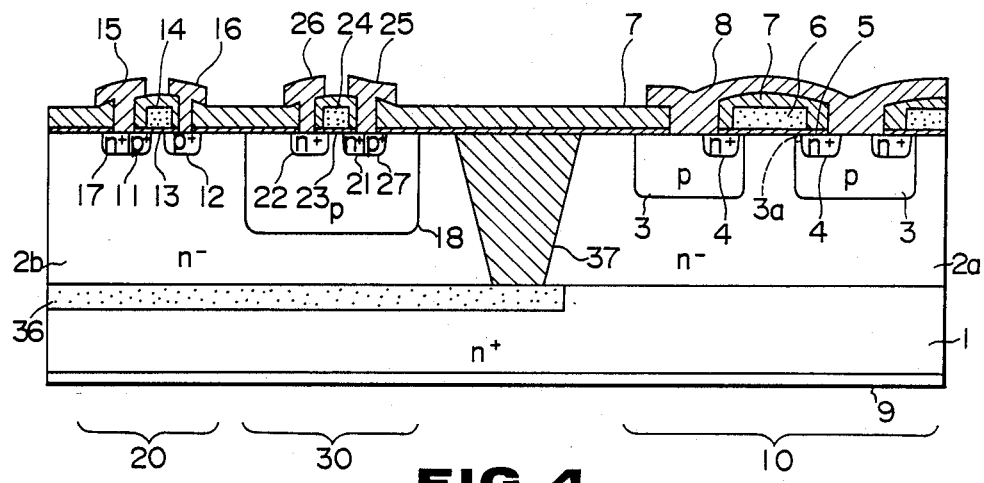
FIG. 4 is a vertical section of a semiconductor device according to a third embodiment of the present invention.

A third embodiment of the present invention is shown in FIG. 4. In the third embodiment, a guard ring 37 is made of insulating material such as $SiO_2$.

The guard ring 37 of $SiO_2$ can be formed in the following manner. A groove reaching the recombination layer 36 is formed by etching in the n− layer 2 at the step of FIG. 3D. Then, the guard ring 37 is formed in the groove by depositing $SiO_2$ and grinding the surface of the deposited $SiO_2$ layer until the $SiO_2$ region is left only in the groove.

The insulating guard ring 37 of the third embodiment prevents the holes injected from the p channel region 3 into the first portion 2a of the n− layer 2, from passing from the first portion 2a to the second portion 2b. Therefore, the device of the third embodiment, too, can prevent latchup of CMOS with the cooperation of the guard ring 37 and the recombination layer 36.

In the first and second embodiments, it is necessary to increase the impurity concentration of the guard ring 33 to a sufficiently high level, and connect the guard ring 33 securely with the recombination layer 35 or 36 in order to ensure sufficient absorption of holes by the guard ring 33. Therefore, the withstand voltage of the device between the supply terminal and the ground terminal is determined by the structure of the guard ring 33, so that it is difficult to obtain a power IC of a high withstand voltage. Furthermore, a long heat treatment is required to diffuse the p-type guard ring 33 because the thickness of the n⁻ layer 2 is increased in VDMOS of a high voltage capability. The structure of the third embodiment does not have these disadvantages because the guard ring 37 is made of an insulating material such as $SiO_2$.

Figure 5:
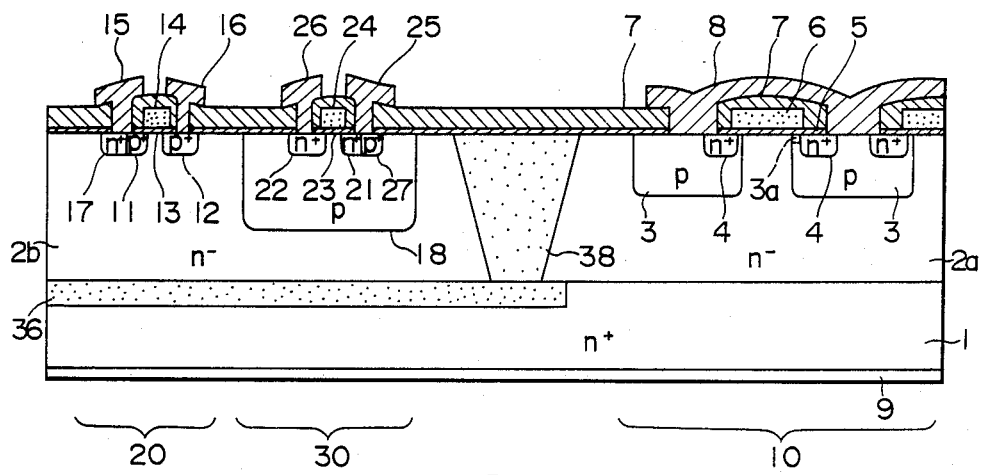
FIG. 5 is a vertical section of a semiconductor device according to a fourth embodiment of the present invention.
Figure 6:
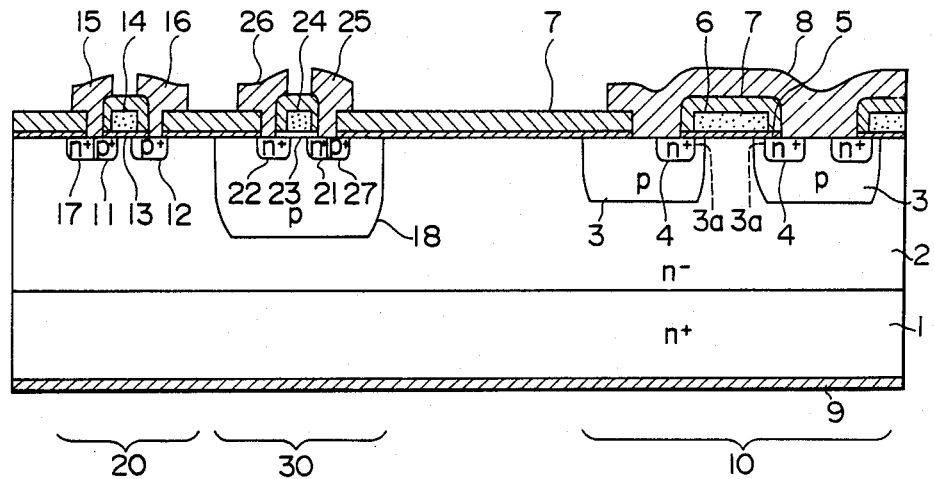
FIG. 6 is a vertical section of a first conventional semiconductor device.
Figure 7:
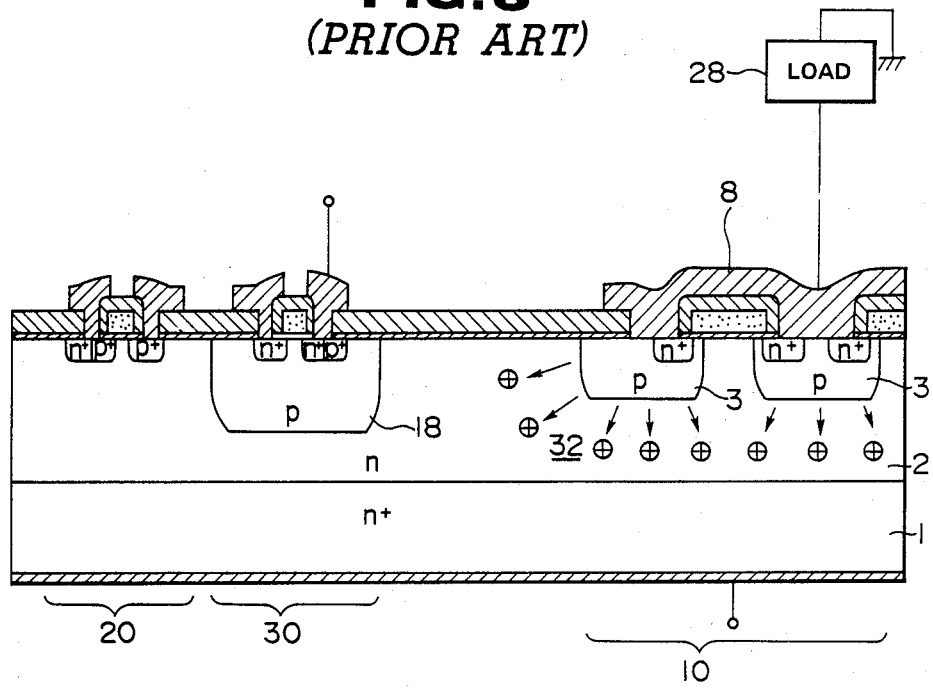
FIG. 7 is a vertical section of the device of FIG. 6 for showing injection of minority carriers from a p-type channel region of a vertical MOSFET into a lightly doped upper layer.

A fourth embodiment of the present invention is shown in FIG. 5. In the fourth embodiment, a guard ring 38 is made of the n-type polycrystalline silicon.

The guard ring 38 of the fourth embodiment can be formed by using the n-type polycrystalline silicon instead of $SiO_2$ almost in the same manner as the $SiO_2$ guard ring 37 of the third embodiment.

The n-type polycrystalline silicon guard ring 38 intercepts the holes which are injected from the p channel 3 and diffusing in the first portion 2a of the n⁻ layer 2 toward the second portion 2b, and causes these holes to rapidly disappear by recombination with electrons. Therefore, the structure of the fourth embodiment, too, can prevent latchup of CMOS.

Because the coefficient of thermal expansion of the n-type polycrystalline silicon is very close to that of the surrounding single crystal Si, the thermal stresses are reduced in the device of the fourth embodiment as compared with the device of the third embodiment having the $SiO_2$ guard ring 37. Therefore, the structure of the fourth embodiment has not only an advantage of high withstand voltage, but also an advantage in durability of the device especially in the case of a power IC having a high current capacity and hence suffering severe evolution of heat.

What is claimed is:
1. A semiconductor device comprising:
   a highly doped lower layer of a first conductivity type, formed in a substrate body,
   a lightly doped upper layer of said first conductivity type, formed above said highly doped lower layer within said body,
   a vertical MOSFET formed in a first portion of said lightly doped upper layer so that said lightly doped layer is used as a substantial drain region of said vertical MOSFET,
   a second circuit component formed in a second portion of said lightly doped upper layer,
   a guard ring formed in said lightly doped upper layer so as to separate said first and second portions, and
   a recombination layer for facilitating recombination of minority carriers, said recombination layer being formed between said highly doped lower layer and at least said second portion of said lightly doped upper layer, said guard ring reaching said recombination layer.

2. A semiconductor device according to claim 1 wherein said recombination layer is made of a material capable of promoting the recombination of carriers.

3. A semiconductor device according to claim 2 wherein said recombination layer is a polycrystalline silicon layer.

4. A semiconductor device according to claim 3 wherein said polycrystalline silicon layer is doped with an impurity of said first conductivity type.

5. A semiconductor device according to claim 1 wherein said recombination layer is formed on said highly doped lower layer, and said first and second portions of said lightly doped upper layer and said guard ring are formed on said recombination layer.

6. A semiconductor device according to claim 1 wherein said recombination layer is formed on said highly doped lower layer, and said second portion and said guard ring are formed on said recombination layer while said first portion of said lightly doped layer is formed directly on said highly doped lower layer.

7. A semiconductor device according to claim 1 wherein said guard ring is a semiconductor region of said second conductivity type, formed in said lightly doped upper layer.

8. A semiconductor device according to claim 1 wherein said guard ring is made of an insulating material.

9. A semiconductor device according to claim 8 wherein said guard ring is made of silicon dioxide.

10. A semiconductor device according to claim 1 wherein said guard ring is a polycrystalline silicon region of said first conductivity type.

11. A semiconductor device according to claim 1, wherein said substrate body has a lower surface bordering said lower layer, and an upper surface bordering said upper layer, said recombination layer being positioned between said upper and lower surfaces of said substrate body, and extends substantially in parallel to said upper and lower surfaces thereof.

12. A semiconductor device according to claim 11, wherein said vertical MOSFET comprises a channel region of a second conductivity type opposite to said first conductivity type, and a source region of said first conductivity type, said channel region extending from said upper surface of said substrate body into said upper layer, said source region extending from said upper surface into said channel region, said recombination layer being deeper within said upper surface of said substrate body than said channel region, so that said channel region does not reach said recombination layer.

13. A semiconductor device according to claim 11, wherein said second circuit component is a CMOS comprising a first pair of source and drain regions of said second conductivity type which both extend from said upper surface of said substrate body into said upper layer, and a second pair of source and drain regions of said first conductivity type which both extend from said upper surface of said substrate body into a wall region of said second conductivity type which extends from said upper surface of said substrate body into said upper layer, wherein said recombination layer is deeper within said upper surface of said substrate body than said well region, so that said wall region is separated from said recombination layer by said upper layer.

14. A semiconductor device according to claim 11, wherein said guard ring extends vertically from said upper surface of said substrate body into said upper layer.

15. A semiconductor device according to claim 1, wherein said recombination layer is a layer having a crystal lattice structure which is more imperfect than either of said upper and lower layers.

16. A semiconductor device according to claim 15, wherein said first layer is formed in a single crystal, and said lower layer is formed in another single crystal.

17. A semiconductor device according to claim 15, wherein said recombination layer is interposed between said upper and lower layers by bonding a first semiconductor wafer comprising said upper layer and a second semiconductor wafer comprising said lower layer.

18. A semiconductor device according to claim 11, wherein said vertical MOSFET comprises a bottom drain electrode formed on said lower surface of said substrate body, a topside source electrode formed on said upper surface of said substrate body, and an insulated gate electrode formed above said upper surface.

* * * * *